United States Patent
Nerukonda et al.

(10) Patent No.: US 10,969,433 B1
(45) Date of Patent: Apr. 6, 2021

(54) METHOD TO COMPRESS RESPONSES OF AUTOMATIC TEST PATTERN GENERATION (ATPG) VECTORS INTO AN ON-CHIP MULTIPLE-INPUT SHIFT REGISTER (MISR)

(71) Applicant: XILINX, INC., San Jose, CA (US)

(72) Inventors: Rambabu Nerukonda, San Jose, CA (US); Ismed D. Hartanto, Castro Valley, CA (US); Aaron K. Mathew, Singapore (SG)

(73) Assignee: XILINX, INC., San Jose, CA (US)

( * ) Notice: Subject to any disclaimer, the term of this patent is extended or adjusted under 35 U.S.C. 154(b) by 28 days.

(21) Appl. No.: 16/554,059

(22) Filed: Aug. 28, 2019

(51) Int. Cl.
*G01R 31/3185* (2006.01)
*G06F 9/30* (2018.01)
*G01R 31/3177* (2006.01)

(52) U.S. Cl.
CPC . *G01R 31/318566* (2013.01); *G01R 31/3177* (2013.01); *G01R 31/318536* (2013.01); *G06F 9/30101* (2013.01); *G06F 9/30134* (2013.01)

(58) Field of Classification Search
CPC .... G01R 31/318566; G01R 31/318536; G01R 31/3177; G06F 9/30134; G06F 9/30101
See application file for complete search history.

*Primary Examiner* — Thien Nguyen
(74) *Attorney, Agent, or Firm* — Patterson + Sheridan, LLP

(57) ABSTRACT

Apparatus and associated methods relate to compacting scan chain output responses of vectors into an on-chip multiple-input shift register (MISR) in the presence of unknown/indeterministic values X in design. In an illustrative example, a system may include a processing engine configured to generate a control signal for a MISR, and the control signal may hold information of what cycle has deterministic output response. The MISR may be configured to compact deterministic output responses of actual scan chain output responses in response to the decoded control signal and compare on-chip MISR signatures with expected MISR signatures to generate pass/fail status of the test. By using the system, unknown/indeterministic values X on the output responses may be blocked from being compacted into the MISR. Accordingly, the on-chip MISR signatures may not be corrupted by the unknown/indeterministic values X, and accuracy of the scan test may be advantageously improved.

20 Claims, 7 Drawing Sheets

METHOD TO COMPRESS RESPONSES OF AUTOMATIC TEST PATTERN GENERATION (ATPG) VECTORS INTO AN ON-CHIP MULTIPLE-INPUT SHIFT REGISTER (MISR)

TECHNICAL FIELD

Various embodiments relate generally to electronic circuits and, in particular, to compact output responses of test vectors of scan chains in an integrated circuit (IC).

BACKGROUND

An integrated circuit (IC), such as an application specific integrated circuit (ASIC) or the like, are designed using design for testability (DFT) techniques. DFT techniques add testability features to circuit design, such as scan chains. A scan chain may be formed by a number of flip flips connected sequentially in a chain. The input of the first flip-flop is connected to an input pin (a "scan-in"), and the output of the last flip-flop is connected to an output pin (a "scan-out").

Scan chains may be inserted into designs to shift in test input data and shift out test result data, and automatic test pattern generation (ATPG) tool may be used to generate test vectors for different fault models. ATPG vectors may be shifted into scan chains first by asserting a scan-enable signal and pulsing scab-clock. Circuit response may be captured into scan flip-flops by de-asserting scan-enable and pulsing functionable clock for few cycles.

An IC can also be designed to perform self-testing using a logic built-in-self-test (LBIST) feature. LBIST can test circuitry in the field and can test internal circuits that have no direct connections to external pins. LBIST can also provide test input to and receive test output from scan chains. An IC can perform LBIST upon being powered on.

SUMMARY

Apparatus and associated methods relate to compacting scan chain output responses of vectors into an on-chip multiple-input shift register (MISR) in the presence of unknown/indeterministic values X in design. In an illustrative example, a system may include a processing engine configured to generate a control signal for a MISR, and the control signal may hold information of what cycle has deterministic output response. The MISR may be configured to compact deterministic output responses of actual scan chain output responses in response to the decoded control signal and compare on-chip MISR signatures with expected MISR signatures to generate pass/fail status of the test. By using the system, unknown/indeterministic values X on the output responses may be blocked from being compacted into the MISR. Accordingly, the on-chip MISR signatures may not be corrupted by the unknown/indeterministic values X, and accuracy of the scan test may be advantageously improved.

Various embodiments may achieve one or more advantages. For example, some embodiments may include multiple designs under test (DUTs) or circuits under test (CUTs), the use of pipeline circuits may enable multiple DUTs or CUTs be tested simultaneously without bringing scan chain output responses to top-level pads. In some embodiments, the scan chain output responses are compacted on-chip, the usage of test memory may be reduced as the test memory may be designed to store expected values on automated test equipment (ATE), and test memory footprint may also be advantageously reduced. Some embodiments may minimize the usage of output pads of DUTs without bringing scan chain output responses to top-level pads. Thus, load capacitances on the output pads may be reduced, and the speed at which data may be shifted into scan chains may be advantageously increased.

In addition, contents of scan chains may no longer be shifted out onto, for example, ATE, to compare captured response with an expected value, the number of output pins used to test a circuit or design may be advantageously reduced. The number of CUTs or DUTs that can be simultaneously tested may be increased to save test time and test cost. Some embodiments may perform the test in the presence of X. Thus, design time and design cost may be advantageously reduced. Some embodiments may use automatic test pattern generation (ATPG) vectors with advanced fault models, which may provide high manufacturing test quality for ICs that have stringent ATPG coverage requirements. The implementation of selection circuit (e.g., a multiplexer) may provide direct tester access for scan chains of any CUTs for debugging and diagnosis purpose. For example, modified ATPG vectors may be used to test multiple CUTs simultaneously, and original ATPG vectors may be used for diagnosis purpose.

In an exemplary aspect, a system includes: (1) a processing engine, and (2) a data store coupled to the processing engine and containing a program of instructions that, when executed by the processing engine, cause the processing engine to perform operations to generate a control signal, the operations includes (a) retrieve input stimulus and expected scan chain output responses, (b) replace indeterministic values in the expected scan chain output responses with corresponding values in the input stimulus to generate modified scan chain output responses; and, (c) generate a control signal that holds information of what cycle has a deterministic output response. The system also includes (3) a scan test controller coupled to scan chain outputs of N designs under test (DUTs), each DUT of the N DUTs is configured to receive corresponding input stimulus and corresponding modified output responses and generate corresponding actual scan chain output responses. The scan test controller includes a multiple-input signature register (MISR), and the MISR is configured to (a) receive deterministic output responses in the actual scan chain output responses in response to the control signal, and (b) generate N corresponding signatures for the N DUTs in response to the received deterministic output responses, N≥1.

In some embodiments, the MISR may also be configured to: compact the received deterministic output responses. In some embodiments, the MISR may also be configured to: (c) retrieve N precalculated expected signatures corresponding to modified output responses; (c) compare the generated N signatures with the N precalculated expected signatures; and, (d) generate a test status signal indicating corresponding test status of each DUT of the N DUTs in response to the comparison result, N≥1.

In some embodiments, the control signal may hold information of what cycle has an indeterministic output response. In some embodiments, the MISR may also be configured to ignore indeterministic output responses in the actual scan chain output responses in response to the control signal. In some embodiments, the scan test controller further comprises a decoding circuit configured to decode the control signal, and the MISR may also be configured to receive deterministic output responses in response to the decoded control signal.

In some embodiments, the system may also include a configuration register configured to store the N precalculated expected signatures. In some embodiments, the system may also include a scan-out pipeline circuit configured to receive the actual scan chain output responses from the N DUTs to generate N parallel actual scan chain output responses, the N parallel actual scan chain output responses may be received by the MISR. In some embodiments, the system may also include a multiplexer configured to receive the parallel actual scan chain output responses and output corresponding output responses in response to a predetermined selection signal. In some embodiments, the predetermined selection signal may be stored in a configuration register.

In another exemplary aspect, a method includes (a) retrieving, by a processing engine, input stimulus and expected scan chain output responses; (b) replacing, by the processing engine, indeterministic values in the expected scan chain output responses with corresponding values in the input stimulus to generate modified scan chain output responses and generating a control signal, (c) coupling a multiple-input signature register (MISR) to scan chain outputs of N designs under test (DUTs), each DUT of the N DUTs is configured to receive corresponding input stimulus and corresponding modified output responses and generate corresponding actual scan chain output responses; (d) receiving, by the MISR, deterministic output responses of the actual scan chain output responses in response to the control signal; and, (e) generating, by the MISR, N signatures in response to the received deterministic output responses, N≥1.

In some embodiments, the method may also include compacting, by the MISR, the received deterministic output responses. In some embodiments, the method may also include (f) retrieving, by the MISR, N precalculated expected signatures corresponding to modified output responses; (g) comparing, by the MISR, the generated N signatures with the N precalculated expected signatures; and, (h) generating, by the MISR, a test status signal indicating corresponding test status of each DUT of the N DUTs in response to the comparison result, N≥1. In some embodiments, the control signal may hold information of what cycle has an indeterministic output response. In some embodiments, the method may also include ignoring, by the MISR, the indeterministic output response in response to the control signal. In some embodiments, the method may also include decoding, by a decoding circuit, the control signal, the decoded control signal may be received by the MISR.

In some embodiments, the method may also include storing, by a configuration register, the N precalculated expected signatures. In some embodiments, the method may also include receiving, by a scan-out pipeline circuit, the actual scan chain output responses from the N DUTs to generate N parallel actual scan chain output responses and configuring the MISR to receive deterministic output responses in response to the decoded control signal. In some embodiments, the method may also include receiving, by a multiplexer, the parallel actual scan chain output responses and outputting corresponding output responses in response to a predetermined selection signal. In some embodiments, the predetermined selection signal may be stored in a configuration register.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to compacting scan chain output responses of vectors into an on-chip multiple-input shift register (MISR) in the presence of unknown/indeterministic values X in design. In an illustrative example, a system may include a processing engine configured to generate a control signal for a MISR, and the control signal may hold information of what cycle has deterministic output response. The MISR may be configured to compact deterministic output responses of actual scan chain output responses in response to the decoded control signal and compare on-chip MISR signatures with expected MISR signatures to generate pass/fail status of the test. By using the system, unknown/indeterministic values X on the output responses may be blocked from being compacted into the MISR. Accordingly, the on-chip MISR signatures may not be corrupted by the unknown/indeterministic values X, and accuracy of the scan test may be advantageously improved.

To aid understanding, this document is organized as follows. First, an exemplary platform (e.g., an FPGA) suitable to control scan test is briefly introduced with reference to FIG. 1. Second, with reference to FIGS. 2-3, the discussion turns to exemplary embodiments that illustrate schematics of a scan test controller. Then, with reference to FIGS. 4-6, systems and methods to configure a scan test controller and methods to perform testing are discussed. Finally, with reference to FIG. 7, another exemplary platform (e.g., a system-on-Chip (SOC)) suitable to perform data communication and signal conversion is briefly introduced.

Figure 1:
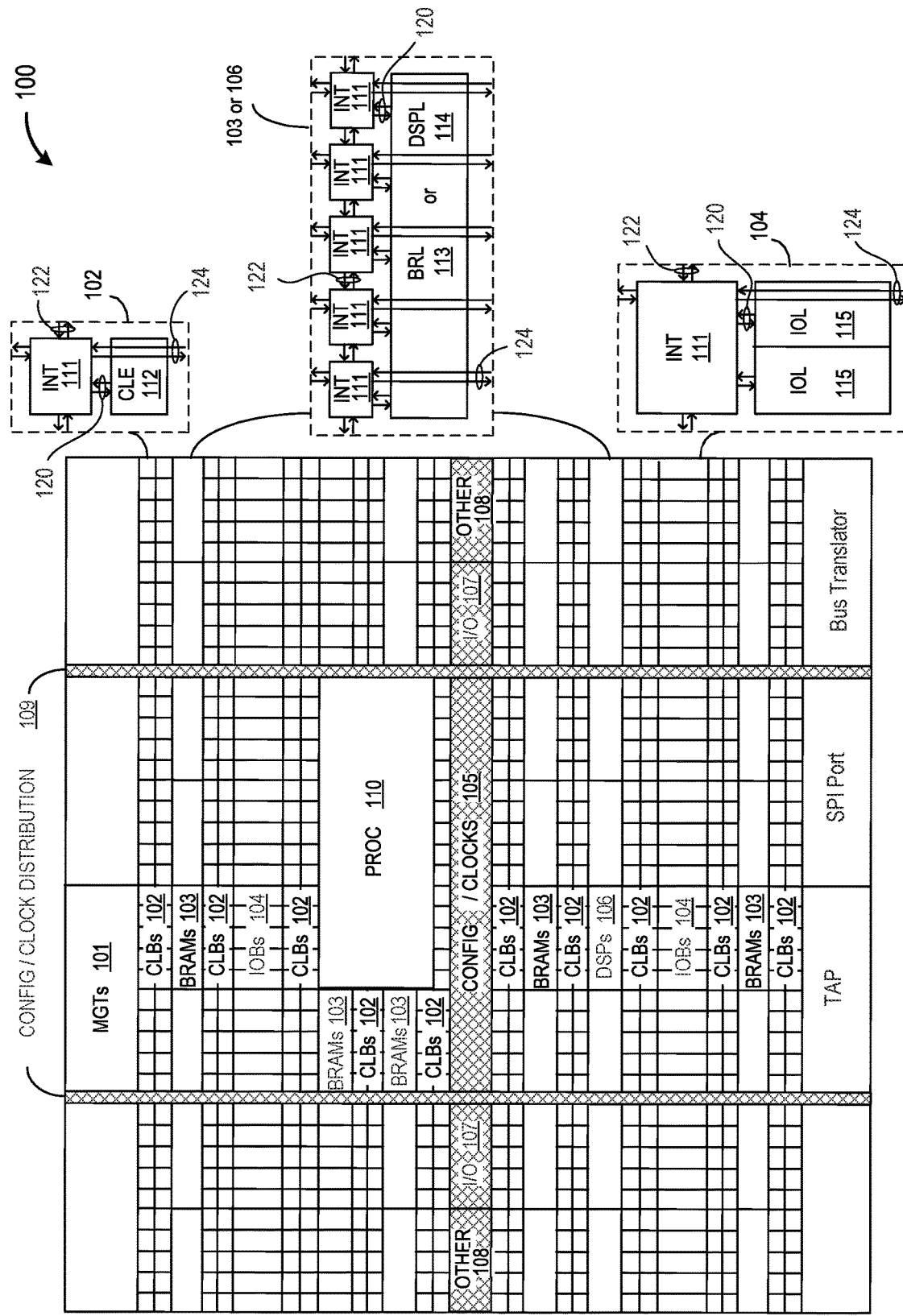
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

IC manufacturers perform scan testing for various reasons, including to test stuck-at faults, to test the paths for delay (e.g., to determine if a path is operating at a functional frequency), and the like. Such scan testing may be performed using automat test equipment (ATE) during manufacture. An IC may make use of scan compression to reduce the amount of data needed to test the IC, which frees up resources of the ATE and can reduce testing costs. ATPG vectors may be used in the manufacturing environment to produce ICs with good quality.

Figure 2:
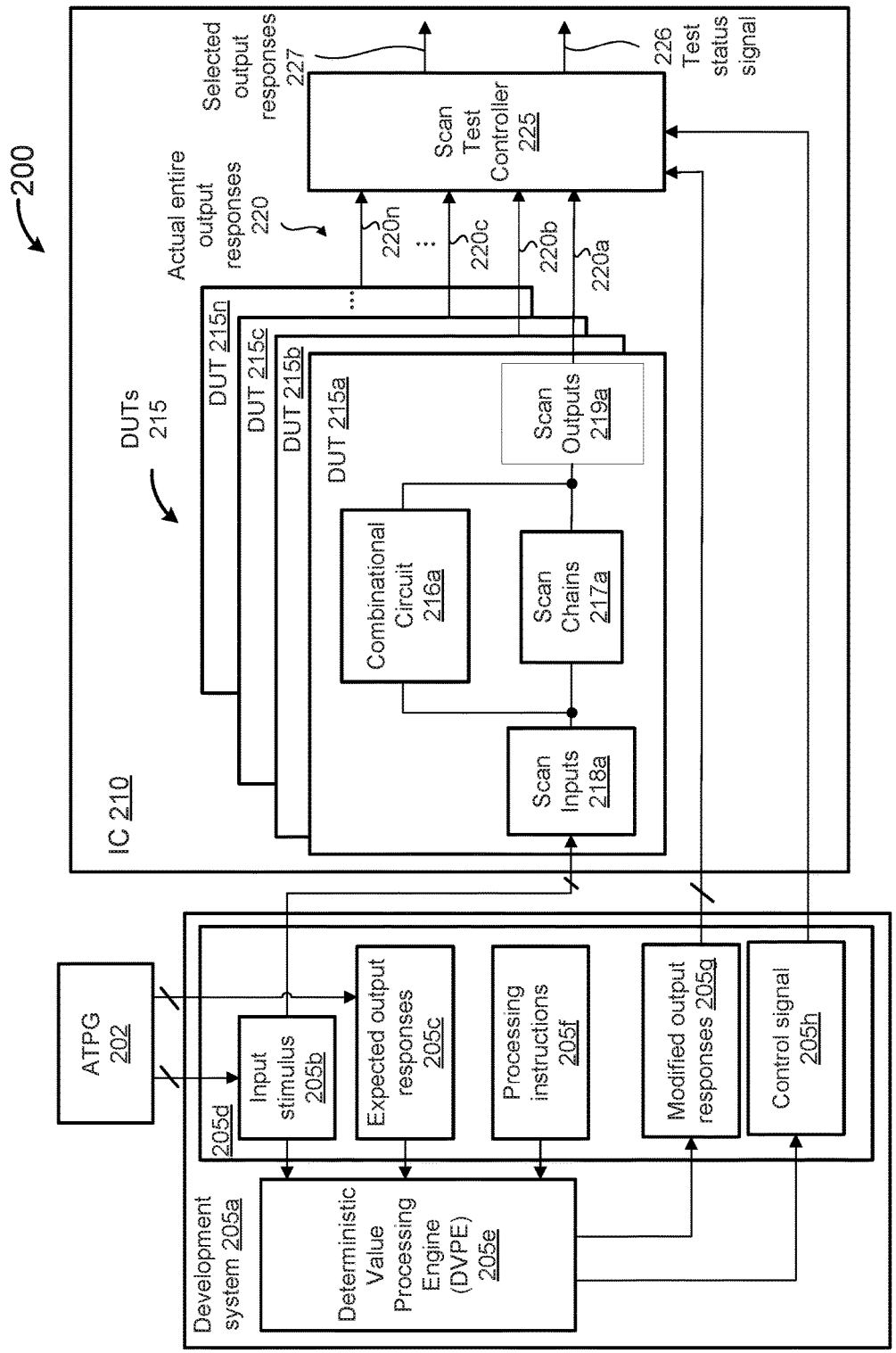
FIG. 2 depicts an exemplary test system for testing one or more designs under test (DUTs).

FIG. 2 depicts an exemplary test system for testing one or more designs under test (DUTs). In this depicted example, an exemplary test system 200 is depicted to test circuits or designs (e.g., circuits under test (CUTs) or designs under test (DUTs)). In this depicted example, a pattern generation tool 202 (e.g., an automatic test pattern generation (ATPG)) tool is used to generate test vectors. A development system 205a is used to process the test vectors and generate inputs for an integrated circuit (IC) 210.

In this depicted example, the test vectors include input stimulus 205b to be applied to inputs of scan chains in one or more DUTs (e.g., N DUTs) and expected output responses 205c of the scan chains in the one or more DUTs. The status of the expected output responses 205c of the scan chains may include deterministic values (e.g., digital 1 or digital 0) and indeterministic values X.

The development system 205a includes memory 205d configured to store the input stimulus 205b and the expected output responses 205c generated by the ATPG 202, for example. The development system 205a also includes a deterministic value processing engine (DVPE) 205e. The DVPE 205e retrieves the input stimulus 205b and the expected output responses 205c from memory 205d to generate modified output responses 205g. More specifically, memory 205d also contains processing instructions 205f, that when executed by the DVPE 205e, cause the DVPE 205e to perform operations to (a) retrieve the input stimulus 205b and the expected output responses 205c, (b) identify the indeterministic values in the expected output responses 205c, (c) replace indeterministic values in the expected output responses 205c with corresponding values in the input stimulus 205b to generate modified output responses 205g, and (d) generate a control signal 205h for a scan test controller 225. The control signal 205h holds information of what cycle has deterministic value and what cycle has indeterministic value in scan chain output responses.

In this depicted example, the input stimulus 205b, the expected output responses 205c, the modified output responses 205g, the processing instructions 205f, and/or the control signal 205h are stored in the same place (e.g., memory 205d). In some embodiments, the input stimulus 205b, the expected output responses 205c, the modified output responses 205g, the processing instructions 205f, and/or the control signal 205h may be stored in one or more different places.

The input stimulus 205b, the modified output responses 205g and the control signal 205h are received by the IC 210. The IC 210 includes N designs under test (DUTs) 215 (e.g., DUT 215a, DUT 215b, DUT 215c, . . . DUT 215n), N≥1. In some embodiments, the IC 210 may include a number of circuits under test (CUTs).

An exemplary DUT 215a of the N DUTs 215 includes a combinational circuit 216a that is designed to perform predetermined logic functions. The combinational circuit 216a may include any combination of logic gates, such as AND gates, OR gates, NAND gates, NOR gates, XOR gates, XNOR gates, multiplexers, buffers, and inverters. In some embodiments, the DUT 215a may include a combinational and sequential logic circuit.

The DUT 215a also includes one or more scan chains 217a. The scan chains 217a is configured to receive corresponding input stimulus through scan inputs 218a and generate related output responses through scan outputs 219a. In this depicted example, the scan outputs 219a of the DUT 215a is configured to input mode to receive corresponding modified output responses 205f. Accordingly, corresponding input stimulus in the input stimulus 205b and the corresponding modified output responses in the modified output responses 205g are both applied to test the DUT 215a. The scan outputs 219a of the DUT 215a may then configured to output mode to generate actual output responses 220a. Each DUT in the DUTs 215 may be configured to generate corresponding actual output responses 220a, 220b, 220c, . . . 220n.

The IC 210 also includes a scan test controller 225 coupled to each of the DUTs 215 to receive the actual entire output responses 220 of all DUTs and generate a test status signal 226 (e.g., pass or fail) of the DUTs 215 in response to the actual entire output responses 220, the modified output responses 205g and the control signal 205h. In some embodiments, when one or more DUTs fail, the scan test controller 225 may also be configured to select corresponding output responses 227 of the failed DUTs to, for example, a tester for debugging purposes. By introducing the scan test controller 225, actual scan chain output responses may be compacted into an on-chip multiple-input signature register (MISR) even in the presence of unknown/indeterministic values. Multiple symmetric designs/circuits may be tested simultaneously without bringing out scan chain output responses of CUTs to top-level pads. An exemplary architecture of the scan test controller 225 is described in further detail with reference to FIG. 3.

Figure 3:
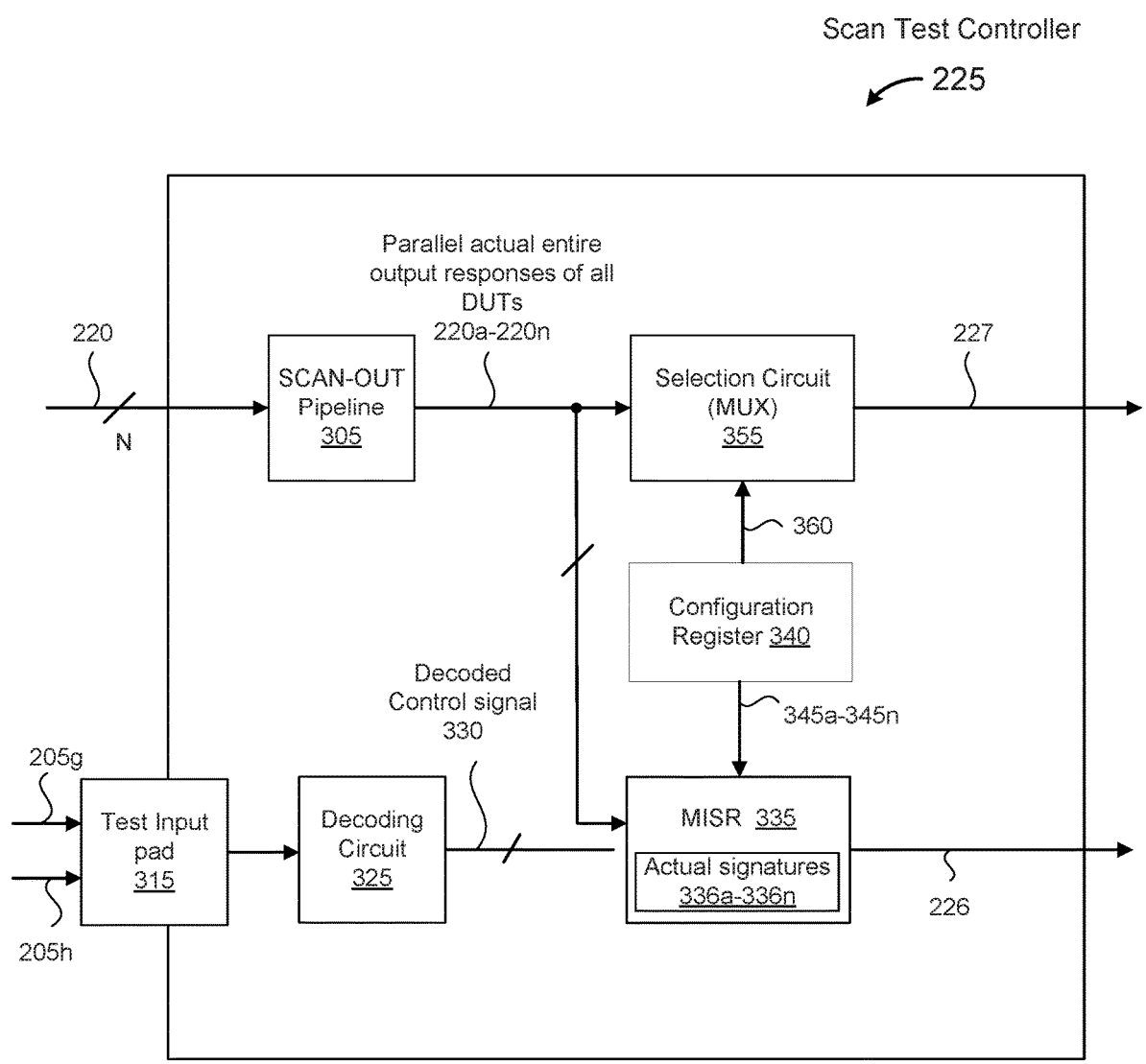
FIG. 3 depicts a block diagram of an exemplary scan test controller implemented in an IC of the test system.

FIG. 3 depicts a block diagram of an exemplary scan test controller implemented in an IC of the test system. In this depicted example, the scan test controller 225 includes a scan-out pipeline 305 coupled to scan outputs (e.g., scan outputs 219a) of the N DUTs 215 to receive the actual entire output responses 220 and output parallel actual output responses 220a-220n of each DUT 215a-215n in the IC 210.

The scan test controller 225 also includes a test input pad 315 coupled to receive the modified output responses 205g and the control signal 205h from the development system 205a. The scan test controller 225 also includes a decoding circuit 325 configured to decode the control signal 205h. The decoded control signal 330 holds information of what cycle has deterministic output response and what cycle has indeterministic output response. In this depicted example, the decoded control signal 330 may include N decoded sub-control signals, each sub-control signal may decide whether the MISR 335 accepts corresponding output responses of a corresponding DUT.

The scan test controller 225 also includes a multiple-input signature register (MISR) 335. The MISR 335 receives the actual parallel output responses 310 from the scan-out pipeline 305 and also receives the decoded control signal 330 from the decoding circuit 325. If the decoded control signal 330 indicates that an output response of the parallel actual output responses 220a-220n is deterministic in a corresponding cycle, then the MISR 335 is enabled to receive the deterministic value. If the decoded control signal 330 indicates that a value of the parallel actual output responses 220a-220n is indeterministic in a corresponding cycle, then the MISR 335 is blocked (e.g., disabled), and the indeterministic value will not be entered into the MISR 335, and the MISR 335 will hold until the next cycle. Accordingly, only valid/deterministic data are compressed into the MISR 335 and MISR content are protected from corrupting by blocking invalid (e.g., indeterministic) data. All valid/deterministic values are then compressed and processed by the MISR 335 to generate actual signatures 336a-336n. Each DUT (e.g., the DUT 215a) may have a corresponding actual signature (e.g., a corresponding actual signature of signatures 336a-336n, n is the number of DUTs 215 in the IC 210).

The scan test controller 225 also includes a configuration register 340. The configuration register 340 stores expected MISR signatures 345a-345n of each DUT of the DUTs 215. The expected MISR signatures 345a-345n may be obtained from the modified output responses 205g. When the actual signatures 336a-336n are available in the MISR 335, then the MISR 335 retrieves the expected MISR signatures 345a-345n from the configuration register 340 to compare the actual signatures 336a-336n with the expected MISR signatures 345a-345n and generates the test status (e.g., pass/fail) signal 226 at the end of test to indicate whether the actual signatures 336a-336n match the expected MISR signatures 345a-345n.

More specifically, when each of the actual signatures 336a-336n matches a corresponding expected signature of the expected MISR signatures 345a-345n, then the MISR 335 is configured to generate a status signal to indicate the DUTs 215 passes the scan test. When at least one of the actual signatures 336a-336n doesn't match a corresponding expected signature of the expected MISR signatures 345a-345n, then the MISR 335 is configured to generate a status signal to indicate the pass/fail status of each DUT in the DUTs 215.

The scan test controller 225 also includes a selection circuit (e.g., a multiplexer) 355 to output corresponding output responses of a failed DUT for further debugging use in response to a corresponding selection signal. The corresponding output responses of a failed DUT may be received by a tester, for example, an automated test equipment (ATE). The configuration register 340 is also configured to store different selection signals 360 to select different output responses from the parallel actual output responses 220a-220n of all DUTs 215. The configuration register 340 may output a corresponding selection signal to select the corresponding output responses in response to the pass/fail signal 350. The selection circuit 355 may be used during $1^{st}$ silicon bring up, ATPG vector debug, or may be used to capture failing cycles of a defective core for diagnosis purpose. For example, the input stimulus 205b and the expected output responses 205c may be applied to capture filing cycle and failing pin information on a tester. In some embodiments, all or part of logic used by the scan test controller 225 may be implemented in the DUTs 215. In some embodiments, all or part of logic used by the scan test controller 225 may be implemented in a programmable logic block of an FPGA.

For example, the IC 210 may include three DUTs. When all the three DUTs pass the test, the MISR 335 may generate a pass signal. When a first DUT of the three DUTs fails the test, the configuration register 340 may receive a corresponding fail signal and output a corresponding selection signal (e.g., a first selection signal). The output responses of the first DUT may be selected to output by the selection circuit 355. The selected output responses may then be analyzed by an ATE, for example. By using the scan test controller, multiple circuits or designs may be tested simultaneously without bringing scan chain output responses to top-level pads. In addition, unknown/indeterministic values of the output responses of the circuits or designs may be blocked from being compacted into the MISR. Accordingly, the actual signature may not be corrupted by the unknown/indeterministic values, and accuracy of the scan test may be advantageously improved. Also, as the scan chain output responses are compacted on-chip, test memory usage may be reduced, and test memory footprint may also be advantageously reduced.

Figure 4:
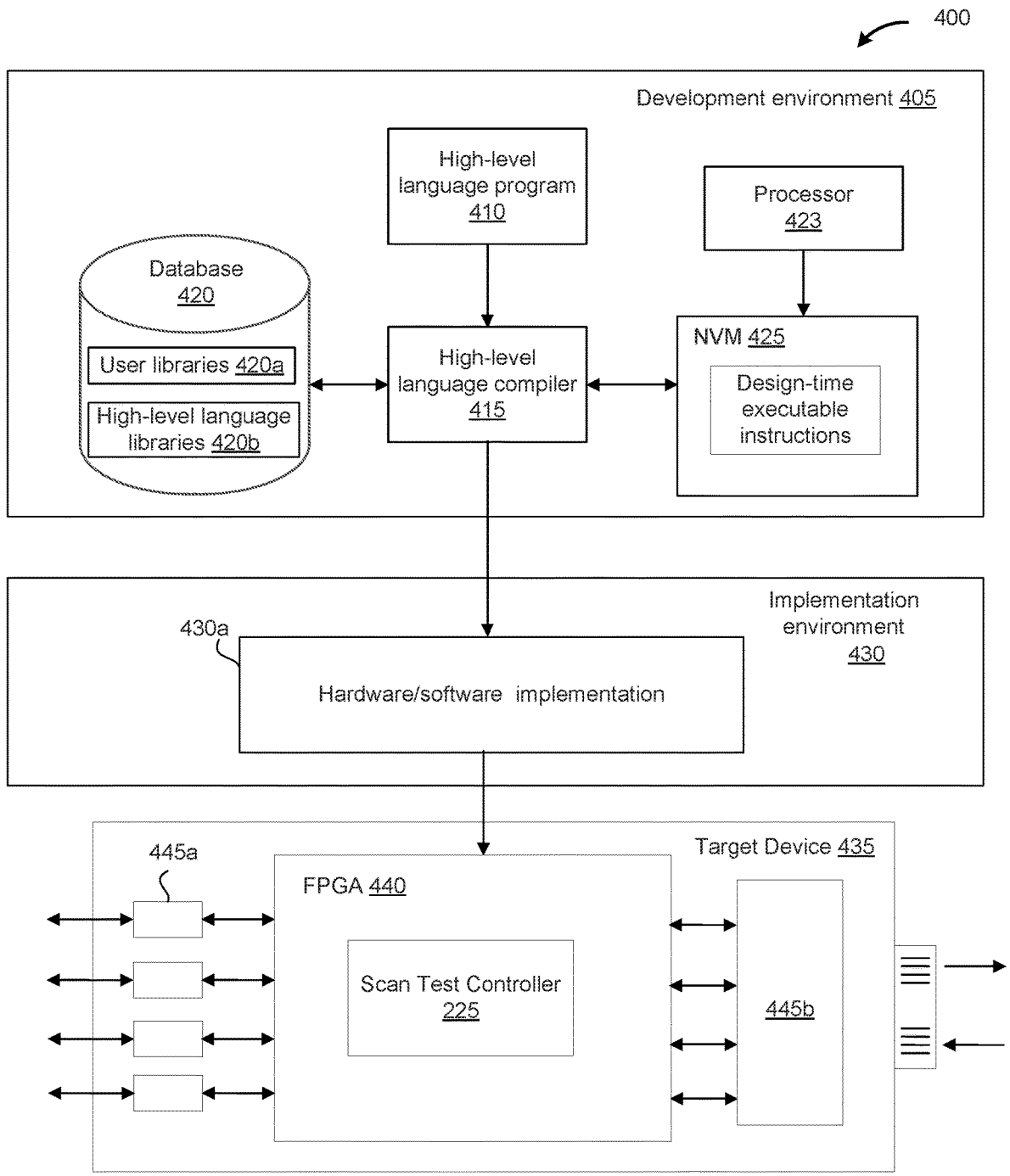
FIG. 4 depicts a block diagram of an exemplary configuration system having a development environment and an implementation environment to implement scan testing in a field programmable gate array (FPGA) device.

FIG. 4 depicts a block diagram of an exemplary configuration system having a development environment and an implementation environment to implement scan testing in a field programmable gate array (FPGA) device.

A configuration system 400 includes a development environment 405. The development environment 405 may be a software suite (such as the Vivado® Suite distributed by Xilinx, Inc) including a number of tools for performing EDA design. A user may, via a user interface, use a high-level language to generate, at design time, instructions that can produce, via register transfer logic (RTL) generation at compile time, a scan test controller that, at run-time, can efficiently perform scan test. The environment 405 includes a, for example, high-level language program 410, such as HDL code, that is used for designing hardware systems. The program 410 may be compiled by a high-level language compiler 415. The HLL compiler 415 operatively connects with the HLL program 410 and a database 420. In this depicted example, the database 420 includes user libraries 420a and HLL libraries 420b. For example, the user libraries 420a may include different pattern generators (e.g., ATPG) that may be used to generate vectors to be used in the scan test. The HLL compiler 415 may select available library files in the database 420 to compile HLL commands into one or more sets of instructions, which may also be referred to as data structures.

The environment 405 may be running on a processor 423 operably coupled to non-volatile memory (NVM) 425. NVM 425 contains instructions, that when executed by the processor 423, cause the processor 423 to perform operations that enable the various tools and functionality of the environment 405. For example, the NVM 425 may include design-time executable instructions that perform various operations involving EDA design. NVM 425 also may include design-time executable instructions that include various programs, routines, and/or operations that are executed during design time for a target device (e.g., when the target device is being configured/set up). In some embodiments, part or all functions of the DVPE 205e may be implemented in the processor 423. In some examples, part or all functions of memory 205d may be implemented in the database 420 or the NVM 425.

The configuration system 400 includes an implementation environment 430. In some examples, the implementation environment 430 may be packaged with the development environment 405. The implementation environment 430 includes various tools 430a for hardware and/or software simulation, synthesis/regeneration, and/or implementation (e.g., place and route). An implementation engineer, for example, may employ some compiler tools to convert the instructions stored in the NVM 425 into hardware/software implementations 430a that can be loaded via a bitstream, for example, into a target device such as an FPGA. In some embodiments, the implementation environment 430 may generate the appropriate data files to realize fixed hardware (e.g., in an ASIC) in accordance with the design specified by, for example, the user-input high-level language programming in the development environment 405.

A target device 435 may, for example, be a system on a chip (SOC) that includes various components, at least one among them being an FPGA 440. The FPGA 440 may be programmed/configured "on-the-fly" to the scan test controller 225 by taking a bitstream of the implementation generated by environments 405 and 430 and writing the bitstream into programmable logic (PL) of the FPGA 440.

The target device 435 includes a number of buffers 445a (e.g., which may form an I/O interface) that connect external signals into the FPGA 440. The FPGA 440 may include n programmable logic blocks that represent programmable hardware resources available to realize circuitry in accordance with the design specified by, for example, the user-input high-level language programming in the development environment 405. The FPGA 440 also connects with other devices 445b, which may provide a variety of auxiliary functions. Exemplary process flow steps that may be performed at design time are described in further detail, for example, with reference to FIG. 5.

Figure 5:
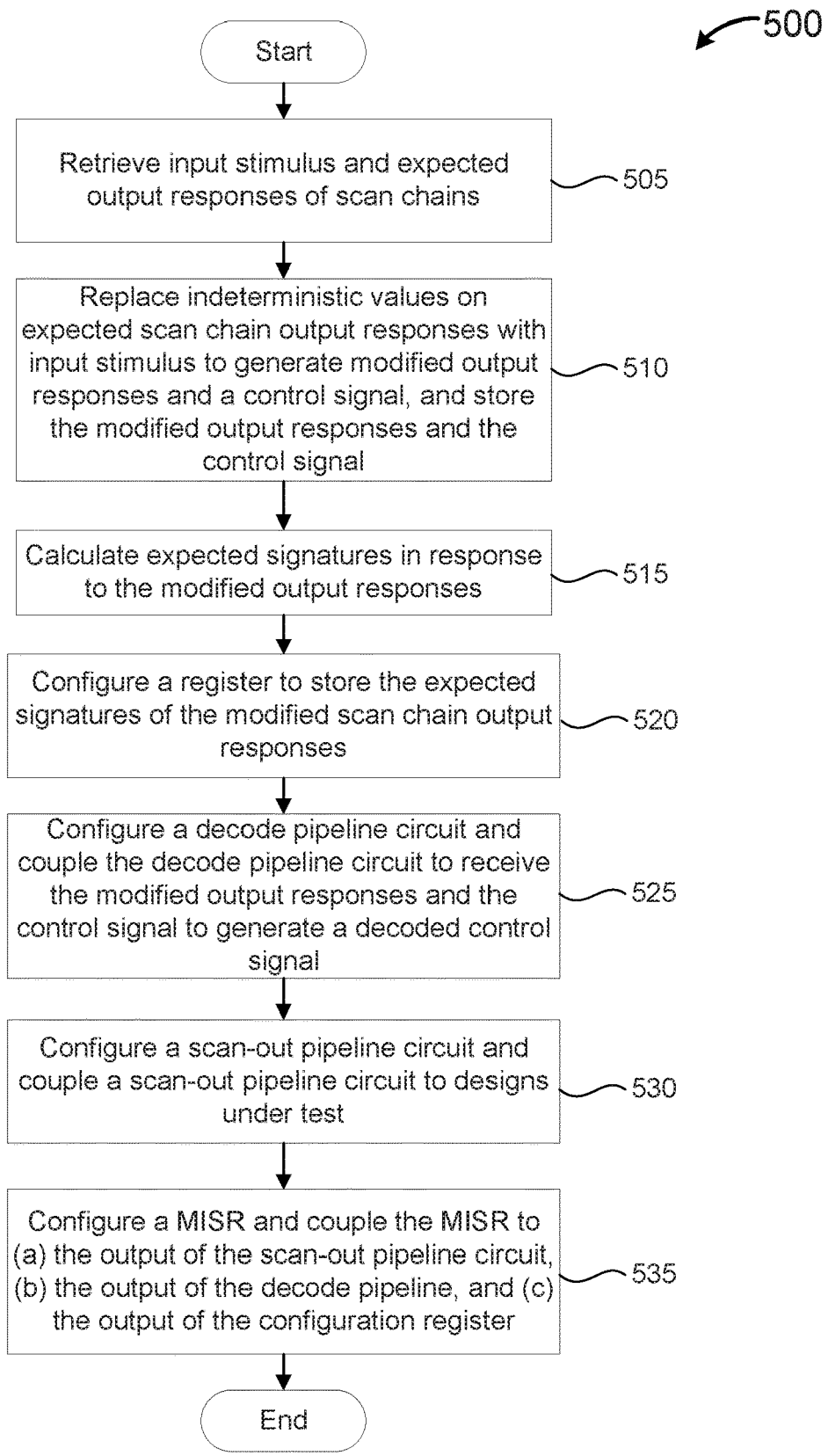
FIG. 5 depicts a flow chart of an exemplary design-time fabric reconfiguration method for a system configured to perform testing.

FIG. 5 depicts a flow chart of an exemplary design-time fabric reconfiguration method for a system configured to perform testing. A method 500, which may be performed at design time by the configuration system 400 to configure the system 200, includes, at 505, retrieving, by the DVPE 205e, input stimulus 205b and expected scan chain output responses 205c of DUTs 215 from memory 205d. In some embodiments, the method may also include generating, for example, by the ATPG tool 202, input stimulus 205b and expected scan chain output responses 205c of DUTs 215 and store the input stimulus 205b and expected scan chain output responses 205c of DUTs 215 in memory 205d.

The method 500 also includes, at 510, replacing, for example, by the DVPE 205e, indeterministic values on expected scan chain output responses 205c with input stimulus 205b to generate modified scan chain output responses 205g and a control signal 205h, and store the modified output responses 205g, and the control signal 205h (e.g., in memory 205g) in memory 205d, for example.

The method 500 also includes, at 515, calculating, for example, by the processor 423, expected signatures (e.g., the expected signatures 345a-345n) in response to the modified output responses 205g. The method 500 also includes, at 520, configuring a register (e.g., the register 340) to store the expected signatures 345a-345n of the modified scan chain output responses 205g. The method 500 also includes, at 525, configuring an input pad (e.g., test input pad 315) and a decoding circuit (e.g., the decoding circuit 325), and coupling the test input pad 315 and the decoding circuit 325 to receive the modified output responses 205g and the control signal 205h to generate a decoded control signal 330.

The method 500 also includes, at 530, configuring a scan-out pipeline circuit (e.g., the scan-out pipeline circuit 305) and coupling the scan-out pipeline circuit 305 to the DUTs 215. The method 500 also includes, at 535, configure a multiple-input signature register (MISR) and couple the MISR (e.g., the MISR 335) to (a) the output of the scan-out pipeline circuit 305, (b) the output of the decoding circuit 325, and (c) the output of the configuration register 340. In some embodiments, if the IC 210 includes only one DUT, then the step 530 to configure the scan-out pipeline circuit 305 may be omitted. The MISR 335 may be configured to directly receive actual output responses from the one DUT in the IC 215.

In some embodiments, the method 500 may also include configuring a selection circuit (e.g., the selection circuit 335)

and coupling the selection circuit 335 to the output of the scan-out pipeline circuit 305 and the other output of the configuration register 340. The method 500 may also include generating, for example, by the processor 423, selection signals 360 and storing the selection signals 360 in the configuration register 340. The method 500 may also include configuring the register 340 to output a corresponding selection signal in response to different instructions (e.g., pass/fail status 350 generated by the MISR 335). In some embodiments, a state machine may be used to control part of the functions of the scan test controller 225. By controlling the compact procedure of the MISR in response to the control signal, unknown/indeterministic values of the output responses of the circuits or designs may be blocked from being compacted into the MISR. Accordingly, the actual signature may not be corrupted by the unknown/indeterministic values, and accuracy of the scan test may be advantageously improved.

Figure 6:
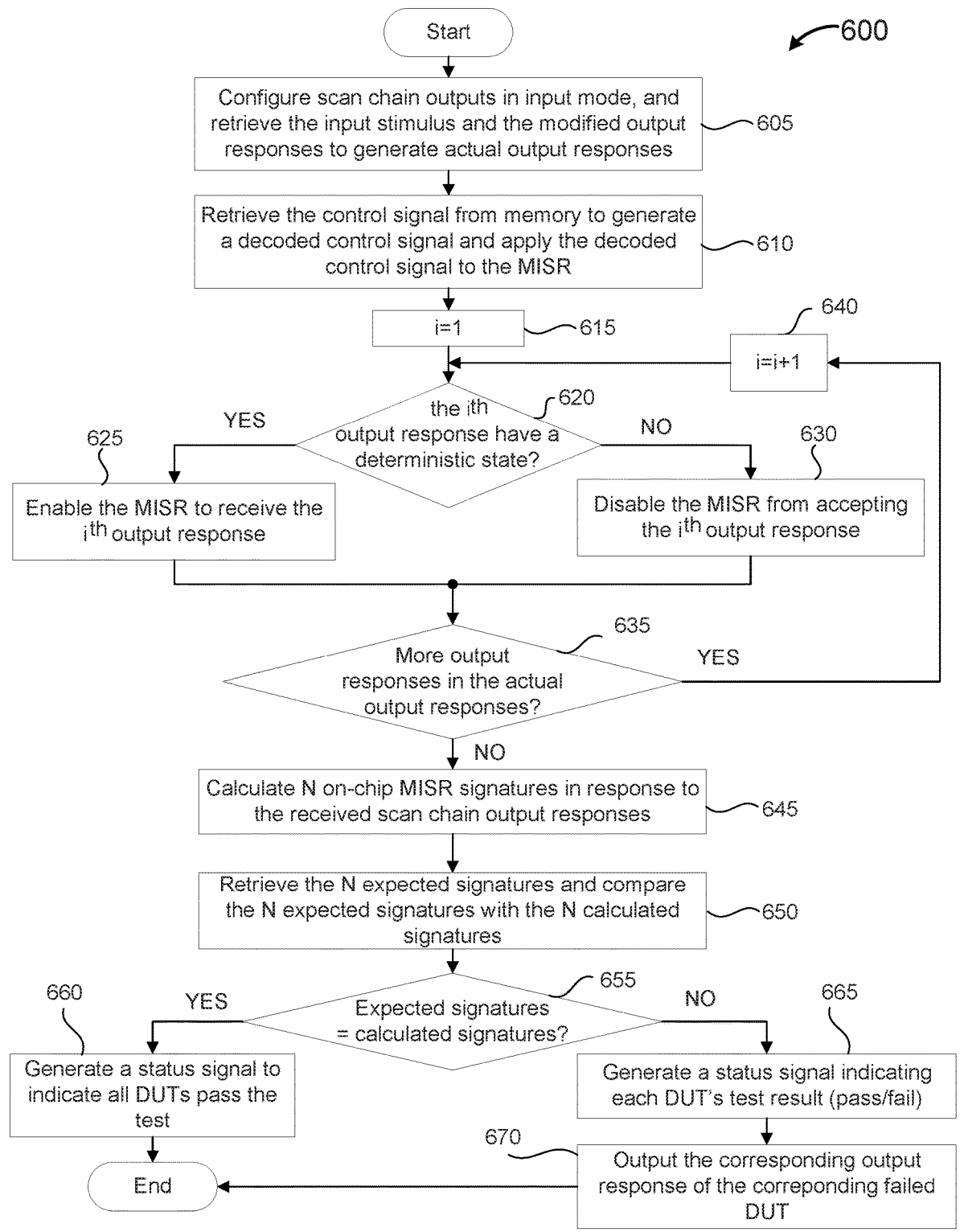
FIG. 6 depicts a flowchart of an exemplary run-time method for performing a test with the scan test controller.

FIG. 6 depicts a flowchart of an exemplary run-time method for performing a test with the scan test controller. A method 600 is discussed to perform scan test with the scan test controller 225. The method 600 includes, at 605, configuring scan chain output (e.g., the scan outputs 219a) of each DUT 215a-215n in input mode and retrieving the input stimulus 205h and the modified output responses 205g, for example, from memory 205d, to generate actual entire output responses 220 of the DUTs 215.

The method 600 also includes, at 610, retrieving, by the test input pad 315 and the decoding circuit 325, the control signal 205h from memory 205d to generate a decoded control signal 330. The decoded control signal 330 hold information of what cycle has deterministic output response and what cycle has indeterministic output response. The method 600 also includes, at 615, introducing a variable i and initialize i=1.

The method 600 also includes, at 620, determining whether an $i^{th}$ output response in the actual entire output responses 220 have a deterministic state. If the decoded control signal 330 indicates the $i^{th}$ output response is deterministic, then, at 625, the MISR 335 is enabled to receive the deterministic output response. If the decoded control signal 330 indicates the $i^{th}$ output response is indeterministic, then, at 630, the MISR 335 is disabled to block the indeterministic output response and hold until the next cycle.

The method 600 also includes, at 635, determining, for example, by the processor 423, whether there are more output responses in the actual entire output responses 220. If the actual entire output responses 220 contains more output responses, then, at 640, the variable i is incremented, and the method loops back to 620. If all output responses in the actual entire output responses 220 are determined at the MISR 335, then, at 645, actual MISR signatures (e.g., actual signatures 336a-336b) are calculated in response to the output responses received by the MISR 335.

The method 600 also includes, at 650, retrieving the expected MISR signatures 345a-345n stored in the register 340 and comparing the expected MISR signatures 345a-345n with the actual signatures 336a-336b. At 655, whether the expected MISR signatures 345a-345n match the actual signatures 336a-336b is determined. If each actual signature of the actual signatures 336a-336b matches a corresponding expected MISR signature, then, at 660, the MISR 335 is configured to generate a status signal to indicate all DUTs pass the test. If at least one of the actual signatures 336a-336n doesn't match a corresponding expected signature of the expected MISR signatures 345a-345n, then, at 665, the MISR 335 is configured to generate a status signal to indicate the pass/fail status of each DUT in the DUTs 215.

In some embodiments, when one or more DUTs in the DUTs 215 fail the scan test, at 670, the configuration register 340 may receive a corresponding fail status signal to output a corresponding selection signal, the corresponding selection signal may be applied to the selection circuit 355 to output corresponding output responses of the failed DUT to, for example, a tester. In some embodiments, the input stimulus 205b may be applied to the failed DUT (received by scan inputs 218a, for example) to generate unmodified output responses. The unmodified output responses may be analyzed to capture failing cycles and failing pin information on the tester. The failing cycles and failing pin information may be then fed to debug and diagnosis tools to root-cause the failures.

In this depicted example, the scan test controller 225 is arranged on the same IC (e.g., IC 210) with the DUTs 215. In another embodiment, the scan test controller 225 may be implemented in a different IC (e.g., another FPGA) to control the test of the DUTs 215.

In some embodiments, the scan test controller 225 may be implemented as hard block fixed circuitry. For example, an application specific integrated circuit (ASIC) may provide a scan test controller for controlling the test of DUTs with customized hardware circuitry. An ASIC implementation may, in some implementations, provide for a minimized platform with respect to, for example, power consumption and/or die area.

In some embodiments, some or all of the functions of the scan test controller 225 may be implemented in a processor that is configured to execute a set of instructions stored in a data store to control the test of the DUTs 215. The processor may be arranged on the same IC 210, which may be an FPGA, with the DUTs 215. For example, the scan test controller 225 and the data store may be implemented in a programmable logic block of a system-on-chip (SOC) or implemented in a hard block using fixed circuitry of the SOC, and the DUTs may be implemented in another hard block using, for example, fixed circuitry of the SOC.

Figure 7:
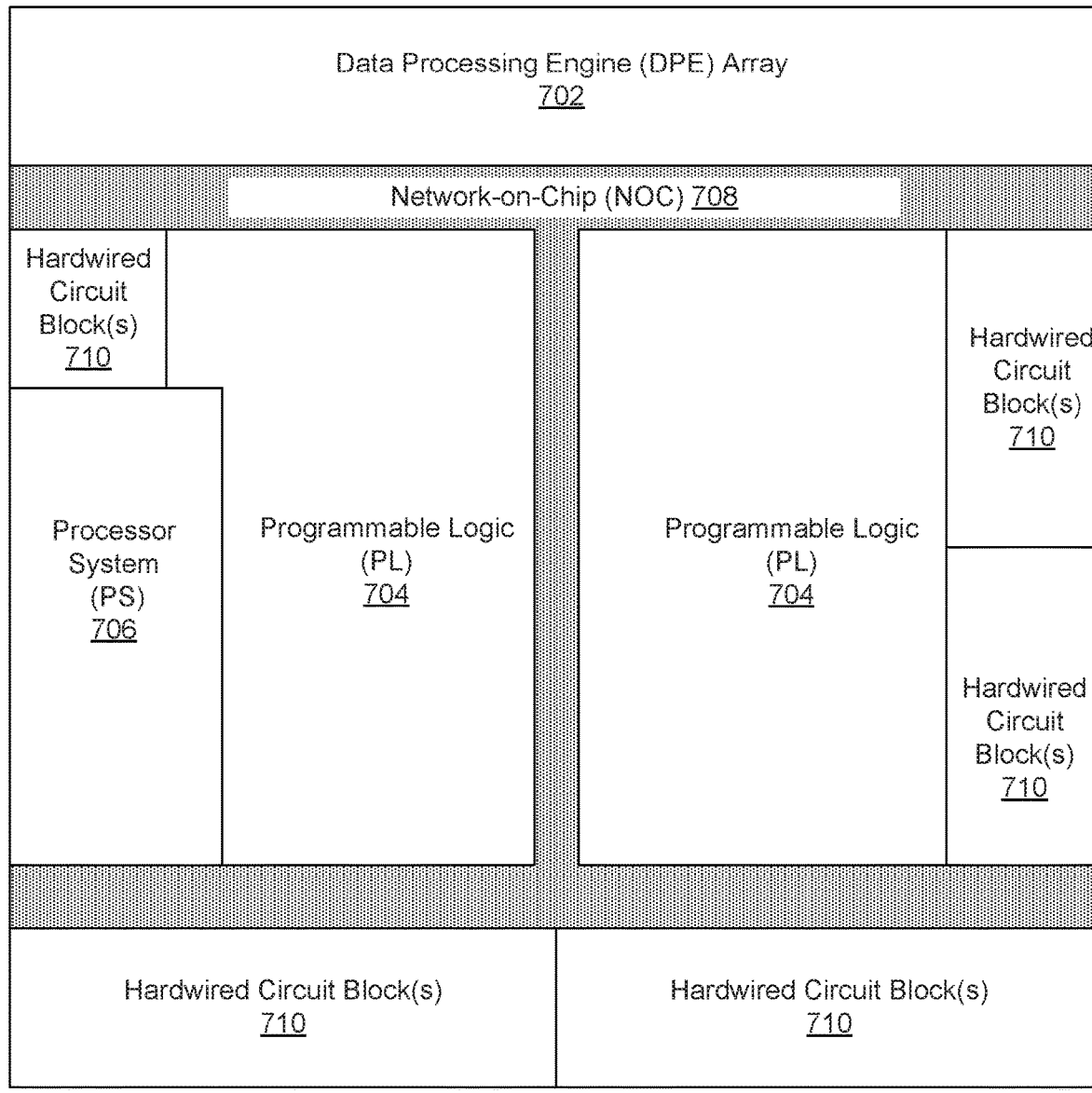
FIG. 7 depicts an example architecture for a System-on-Chip (SOC) on which the disclosed circuits and processes may be implemented.

FIG. 7 depicts an example architecture for a System-on-Chip (SOC) on which the disclosed circuits and processes may be implemented. SOC 700 is an example of a programmable IC and an integrated programmable device platform. In the example of FIG. 6, the various, different subsystems or regions of the SOC 700 illustrated may be implemented on a single die provided within a single integrated package. In other examples, the different subsystems may be implemented on a plurality of interconnected dies provided as a single, integrated package.

In the example, the SOC 700 includes a plurality of regions having circuitry with different functionalities. In the example, the SOC 700 optionally includes a data processing engine (DPE) array 702. SOC 700 includes programmable logic (PL) regions 704 (hereafter PL region(s) or PL), a processing system (PS) 706, a Network-on-Chip (NOC) 708, and one or more hardwired circuit blocks 710. DPE array 702 is implemented as a plurality of interconnected, hardwired, and programmable processors having an interface to the other regions of the SOC 700.

PL 704 is circuitry that may be programmed to perform specified functions. As an example, PL 704 may be implemented as field programmable gate array type of circuitry. PL 704 can include an array of programmable circuit blocks. Examples of programmable circuit blocks within PL 704 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 704 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 706 is implemented as hardwired circuitry that is fabricated as part of the SOC 700. The PS 706 may be implemented as, or include, any of a variety of different processor types each capable of executing program code. For example, PS 706 may be implemented as an individual processor, e.g., a single core capable of executing program code. In another example, PS 706 may be implemented as a multicore processor. In still another example, PS 706 may include one or more cores, modules, co-processors, interfaces, and/or other resources. PS 706 may be implemented using any of a variety of different types of architectures. Example architectures that may be used to implement PS 706 may include, but are not limited to, an ARM processor architecture, an x86 processor architecture, a GPU architecture, a mobile processor architecture, a DSP architecture, or other suitable architecture that is capable of executing computer-readable instructions or program code.

NOC 708 includes an interconnecting network for sharing data between endpoint circuits in SOC 700. The endpoint circuits can be disposed in DPE array 702, PL regions 704, PS 706, and/or in hardwired circuit blocks 710. NOC 708 can include high-speed data paths with dedicated switching. In an example, NOC 708 includes horizontal paths, vertical paths, or both horizontal and vertical paths. The arrangement and number of regions shown in FIG. 6 is merely an example. The NOC 708 is an example of the common infrastructure that is available within the SOC 700 to connect selected components and/or subsystems.

NOC 708 provides connectivity to PL 704, PS 706, and to selected ones of the hardwired circuit blocks 710. NOC 708 is programmable. In the case of a programmable NOC used with other programmable circuitry, the nets that are to be routed through NOC 708 are unknown/indeterministic until a user circuit design is created for implementation within the SOC 700. NOC 708 may be programmed by loading configuration data into internal configuration registers that define how elements within NOC 708 such as switches and interfaces are configured and operate to pass data from switch to switch and among the NOC interfaces.

NOC 708 is fabricated as part of the SOC 700 and while not physically modifiable, may be programmed to establish connectivity between different master circuits and different slave circuits of a user circuit design. NOC 708, for example, may include a plurality of programmable switches that are capable of establishing packet switched network connecting user specified master circuits and slave circuits. In this regard, NOC 708 is capable of adapting to different circuit designs, where each different circuit design has different combinations of master circuits and slave circuits implemented at different locations in the SOC 700 that may be coupled by NOC 708. NOC 708 may be programmed to route data, e.g., application data and/or configuration data, among the master and slave circuits of the user circuit design. For example, NOC 708 may be programmed to couple different user-specified circuitry implemented within PL 704 with PS 706, and/or DPE array 702, with different hardwired circuit blocks, and/or with different circuits and/or systems external to the SOC 700.

The hardwired circuit blocks 710 may include input/output (I/O) blocks, and/or transceivers for sending and receiving signals to circuits and/or systems external to SOC 700, memory controllers, or the like. Examples of different I/O blocks may include single-ended and pseudo differential I/Os and high-speed differentially clocked transceivers. Further, the hardwired circuit blocks 710 may be implemented to perform specific functions. Examples of hardwired circuit blocks 710 include, but are not limited to, cryptographic engines, digital-to-analog converters, analog-to-digital converters, and the like. The hardwired circuit blocks 710 within the SOC 700 may be referred to herein from time-to-time as application-specific blocks.

In the example of FIG. 6, PL 704 is shown in two separate regions. In another example, PL 704 may be implemented as a unified region of programmable circuitry. In still another example, PL 704 may be implemented as more than two different regions of programmable circuitry. The particular organization of PL 704 is not intended as a limitation. In this regard, SOC 700 includes one or more PL regions 704, PS 706, and NOC 708. DPE array 702 may be optionally included.

In other example implementations, the SOC 700 may include two or more DPE arrays 702 located in different regions of the IC. In still other examples, the SOC 700 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (OBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments have been described with reference to the figures, other embodiments are possible. For example, the scan test controller and/or the method to compact scan chain output responses to an on-chip MISR may be extended to other structural test methodologies, for example, Memory Built-In Self-Test (MBIST) and/or Joint Test Action Group (JTAG).

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:
1. A system, comprising:
   a processing engine;
   a data store coupled to the processing engine and containing a program of instructions that, when executed by the processing engine, cause the processing engine to perform operations to generate a control signal, the operations comprising:
   (a1) retrieve input stimulus and expected scan chain output responses;
   (b1) replace indeterministic values in the expected scan chain output responses with corresponding values in the input stimulus to generate modified scan chain output responses; and,
   (c1) generate a control signal that holds information of what cycle has a deterministic output response,
   a scan test controller coupled to scan chain outputs of N designs under test (DUTs), each DUT of the N DUTs is configured to receive corresponding input stimulus and corresponding modified output responses and generate corresponding actual scan chain output responses, the scan test controller comprising a multiple-input signature register (MISR), wherein the MISR is configured to:
   (a2) receive deterministic output responses in the actual scan chain output responses based on the control signal;
   (b2) generate N corresponding signatures for the N DUTs based on the received deterministic output responses, N≥1.

2. The system of claim 1, wherein the MISR is further configured to: compact the received deterministic output responses.

3. The system of claim 1, wherein the MISR is further configured to:
   (c2) retrieve N precalculated expected signatures corresponding to modified output responses;
   (d2) compare the generated N signatures with the N precalculated expected signatures; and,
   (e2) generate a test status signal indicating corresponding test status of each DUT of the N DUTs based on the comparison result, N≥1.

4. The system of claim 3, wherein the control signal further holds information of what cycle has an indeterministic output response.

5. The system of claim 4, wherein the MISR is further configured to not receive indeterministic output responses in the actual scan chain output responses based on the control signal.

6. The system of claim 5, wherein the scan test controller further comprises a decoding circuit configured to decode the control signal, and the MISR is configured to receive deterministic output responses based on the decoded control signal.

7. The system of claim 5, further comprising: a configuration register configured to store the N precalculated expected signatures.

8. The system of claim 5, further comprising:
   a scan-out pipeline circuit configured to receive the actual scan chain output responses from the N DUTs to generate N parallel actual scan chain output responses, wherein the N parallel actual scan chain output responses are received by the MISR.

9. The system of claim 8, further comprising: a multiplexer configured to receive the parallel actual scan chain output responses and output corresponding output responses based on a predetermined selection signal.

10. The system of claim 9, wherein the predetermined selection signal is stored in a configuration register.

11. A method, comprising:
   (a) retrieving, by a processing engine, input stimulus and expected scan chain output responses;

(b) replacing, by the processing engine, indeterministic values in the expected scan chain output responses with corresponding values in the input stimulus to generate modified scan chain output responses and generating a control signal;

(c) coupling a multiple-input signature register (MISR) to scan chain outputs of N designs under test (DUTs), each DUT of the N DUTs is configured to receive corresponding input stimulus and corresponding modified output responses and generate corresponding actual scan chain output responses;

(d) receiving, by the MISR, deterministic output responses of the actual scan chain output responses based on the control signal; and, (e) generating, by the MISR, N signatures based on the received deterministic output responses, N≥1.

12. The method of claim 11, further comprising: compacting, by the MISR, the received deterministic output responses.

13. The method of claim 11, further comprising:

(f) retrieving, by the MISR, N precalculated expected signatures corresponding to modified output responses;

(g) comparing, by the MISR, the generated N signatures with the N precalculated expected signatures; and, (h) generating, by the MISR, a test status signal indicating corresponding test status of each DUT of the N DUTs based on the comparison result, N≥1.

14. The method of claim 13, wherein the control signal further holds information of what cycle has an indeterministic output response.

15. The method of claim 14, further comprising: ignoring, by the MISR, the indeterministic output response based on the control signal.

16. The method of claim 15, further comprising: decoding, by a decoding circuit, the control signal, and configuring the MISR to receive deterministic output responses based on the decoded control signal.

17. The method of claim 15, further comprising: storing, by a configuration register, the N precalculated expected signatures.

18. The method of claim 15, further comprising:

receiving, by a scan-out pipeline circuit, the actual scan chain output responses from the N DUTs to generate N parallel actual scan chain output responses, wherein the N parallel actual scan chain output responses are received by the MISR.

19. The method of claim 18, further comprising: receiving, by a multiplexer, the parallel actual scan chain output responses and outputting corresponding output responses based on a predetermined selection signal.

20. The method of claim 19, wherein the predetermined selection signal is stored in a configuration register.

* * * * *